United States Patent
Korthikanti et al.

(10) Patent No.: US 8,904,320 B2
(45) Date of Patent: Dec. 2, 2014

(54) SOLVING MULTIPLICATION CONSTRAINTS BY FACTORIZATION

(71) Applicant: Synopsys, Inc., Mountain View, CA (US)

(72) Inventors: Vijay Anand Korthikanti, Santa Clara, CA (US); Dhiraj Goswami, Wilsonville, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/802,450

(22) Filed: Mar. 13, 2013

(65) Prior Publication Data

US 2014/0282316 A1    Sep. 18, 2014

(51) Int. Cl.
   *G06F 17/50* (2006.01)

(52) U.S. Cl.
   CPC ................... *G06F 17/5045* (2013.01)
   USPC ........................................... 716/106; 716/107

(58) Field of Classification Search
   CPC  G06F 17/505; G06F 17/5045; G06F 17/5081
   USPC .................................................. 716/100–108
   See application file for complete search history.

(56) References Cited

U.S. PATENT DOCUMENTS

| | | | |
|---|---|---|---|
| 5,590,049 A | 12/1996 | Arora | |
| 6,219,809 B1 | 4/2001 | Noy | |
| 6,339,837 B1 | 1/2002 | Li | |
| 6,378,096 B1 | 4/2002 | Chakradhar et al. | |
| 6,519,727 B2 | 2/2003 | Noy | |
| 6,609,230 B1 | 8/2003 | Li | |
| 6,684,359 B2 | 1/2004 | Noy | |
| 6,816,825 B1 * | 11/2004 | Ashar et al. | 703/14 |
| 6,918,076 B2 | 7/2005 | Lagoon et al. | |
| 7,003,749 B2 | 2/2006 | Subasic et al. | |
| 7,107,553 B2 | 9/2006 | Lockyear et al. | |
| 7,114,111 B2 | 9/2006 | Noy | |
| 7,191,107 B2 | 3/2007 | Andrzejak et al. | |
| 7,194,713 B2 | 3/2007 | Iwashita | |
| 7,257,786 B1 | 8/2007 | Kukula | |
| 7,260,562 B2 | 8/2007 | Czajkowski et al. | |
| 7,266,534 B2 | 9/2007 | Emek et al. | |
| 7,284,177 B2 | 10/2007 | Hollander et al. | |
| 7,292,904 B2 | 11/2007 | Denton et al. | |
| 7,315,996 B2 | 1/2008 | Baumgartner et al. | |

(Continued)

OTHER PUBLICATIONS

Colmerauer, Alain. "Solving the multiplication constraint in several approximation spaces." Lecture Notes in Computer Science (2001): 1-1.

*Primary Examiner* — Paul Dinh
(74) *Attorney, Agent, or Firm* — Adams Intellex, PLC

(57) ABSTRACT

A design description for verification includes a set of constraints on random variables within the design description. The set of constraints includes at least one multiplication constraint involving at least two random variables. A computer-based tool obtains designs and analyzes the design description to find the set of constraints and identify the multiplication constraint. The computer-based tool then performs factorization to solve for the multiplication constraint and to determine a set of potentially valid factoring values for the random variables used in the multiplication constraint. The design problem is then solved by the computer-based tool using the factoring values. If two multiplication constraints involve a common variable, the factorization finds a set of common factoring values between the two multiplication constraints to use for the common variable.

36 Claims, 6 Drawing Sheets

(56) References Cited

U.S. PATENT DOCUMENTS

| | | |
|---|---|---|
| 7,333,968 B2 | 2/2008 | Geller et al. |
| 7,386,521 B2 | 6/2008 | Adir et al. |
| 7,409,377 B2 | 8/2008 | Emek et al. |
| 7,509,605 B2 | 3/2009 | Baumgartner et al. |
| 7,512,912 B1 | 3/2009 | Iyer |
| 7,530,036 B2 | 5/2009 | Nahir et al. |
| 7,606,776 B1 | 10/2009 | Havens et al. |
| 7,613,973 B2 | 11/2009 | Lagoon et al. |
| 7,617,468 B2 | 11/2009 | Thakur et al. |
| 7,742,907 B2 | 6/2010 | Gupta et al. |
| 7,761,818 B2 | 7/2010 | Gray et al. |
| 7,779,378 B2 | 8/2010 | Baumgartner et al. |
| 7,788,616 B2 | 8/2010 | Baumgartner et al. |
| 7,793,242 B2 | 9/2010 | Baumgartner et al. |
| 7,797,123 B2 | 9/2010 | De et al. |
| 7,797,648 B1 * | 9/2010 | Huang .................... 716/111 |
| 7,870,523 B1 | 1/2011 | Uziel et al. |
| 8,020,125 B1 | 9/2011 | Kuehlmann et al. |
| 8,042,086 B2 | 10/2011 | Tseng |
| 8,065,255 B2 | 11/2011 | Colena et al. |
| 8,099,690 B2 | 1/2012 | Goswami et al. |
| 8,099,695 B1 | 1/2012 | Lehavot et al. |
| 8,099,696 B2 | 1/2012 | Lehavot et al. |
| 8,104,001 B2 | 1/2012 | Lehavot et al. |
| 8,108,745 B2 | 1/2012 | Kikta et al. |
| 8,150,787 B2 | 4/2012 | Maturana |
| 8,230,263 B2 | 7/2012 | Mukherjee et al. |
| 8,296,697 B2 | 10/2012 | Gal et al. |
| 8,302,062 B2 | 10/2012 | Gray et al. |
| 8,316,332 B1 | 11/2012 | Goyal et al. |
| 8,386,974 B2 | 2/2013 | Biswas et al. |
| 8,413,089 B2 | 4/2013 | Qiang et al. |
| 8,413,099 B2 | 4/2013 | Mottaez et al. |
| 2005/0044512 A1 * | 2/2005 | Lockyear et al. .................. 716/1 |
| 2008/0235640 A1 | 9/2008 | Gal et al. |
| 2009/0031259 A1 | 1/2009 | Gray et al. |
| 2009/0319252 A1 | 12/2009 | De et al. |
| 2010/0017352 A1 | 1/2010 | Maturana |
| 2010/0191679 A1 | 7/2010 | Hung et al. |
| 2010/0218149 A1 | 8/2010 | Sasaki |
| 2010/0223266 A1 | 9/2010 | Balmin et al. |
| 2010/0275169 A1 | 10/2010 | Goswami et al. |
| 2011/0067016 A1 | 3/2011 | Mizrachi et al. |
| 2012/0023149 A1 | 1/2012 | Kinsman et al. |
| 2012/0136635 A1 * | 5/2012 | Hung et al. ....................... 703/2 |
| 2012/0253754 A1 | 10/2012 | Goswami et al. |
| 2012/0278675 A1 | 11/2012 | Qiang et al. |

* cited by examiner

```
program prog;
  class cls;
    rand bit [31:0] a, b, c, d;
    constraint factorization {
      a * b * c == 40;
      d[7:3] > c[6:2];
      a + b > c;
    }
  endclass cls C;

initial
    begin
      C = new;
      repeat(5)
        C.randomize;
    end
endprogram
```

FIG. 3

```
raceSolveProblem(rsa)
rsa: input race solver adapter with ckt, problem info, multiplication_info
{
1:   while((var = get_decision_var(ckt->decision_variables) != NULL) {        ← 410
2:
3:     if (in_multiplication(var) && can_solve_factorization(var, mulitplication_info)) {        ← 420
4:       decision = solve_factorization(ckt, var, multiplication_info);        ← 430
5:     }
6:     if (!decision) {
7:       decision = make_atpg_decision(ckt, var);        ← 440
8:     }
9:     if (inconsistent_decision(decision, ckt)) {
10:      backtrack_decision(decision, ckt);        ← 450
11:    }
12: }
}
```

*FIG. 4*

SOLVING MULTIPLICATION CONSTRAINTS BY FACTORIZATION

FIELD OF ART

This application relates generally to semiconductor circuit design and more particularly to solving multiplication constraints by factorization in a design tool.

BACKGROUND

Various tools may be used in semiconductor circuit design and validation. Some tools use constrained random verification to test the functionality of complex modern circuit arrangements. When performing constrained random verification, a test bench generates a random (or pseudo-random) set of test vectors which may represent a much wider range of values than possible using fixed sequences. However, arbitrary, random values may not properly stimulate a design in situ. Thus, the random values must be constrained to encapsulate the context of the system or subsystem being tested. The constraints may be hard constraints or soft constraints. A hard constraint is a constraint that must always be met, while a soft constraint is a constraint that should be met if possible, but may be ignored if necessary. Due to the complexity of modern electronic systems, constraint with contradictory or otherwise incompatible values may appear in the same system either due to mistakes by the individual or individuals defining the constraints or interactions between the constraints which are not easy to understand.

Constraints on a random value may take many different forms. A constraint may limit the random value to a fixed range of values spanning a set of values less than a constant or between two constants. The range may also be limited to a single constant value. A constraint may fix a relationship between two or more random variables. Examples of such relationships may include the equation $x>y$, $a=b$, or $h>k\geq m$, where the variables are random variables. In some cases, the constraints may combine relationships with other variables and constants, such as $x<14<z$. Some constraints may use arithmetic operators in the process of defining the constraint. These arithmetic operators may be any type of operator, depending on the operators supported by the active tool, and may involve a mix of constants and multiple random variables. One example of a potential constraint when using arithmetic operators is $y+x \times z=201$. Two constraints that share a common random variable may interact. For example, if $a=5$ and $a=b$, then $b=5$ as well, even if the constraint was not explicitly stated. Such interactions may be referred to as implications. The use of arithmetic operators in constraints may lead to even more complex implications.

SUMMARY

A set of constraints for a design problem includes at least one multiplication constraint involving at least two random variables. One way to solve for a constraint on a random variable is to randomly pick a value for the variable and then to test the random value against the constraints. This technique may prove very inefficient. For example, if "a" is a random 32-bit integer variable, it may take on one of $2^{32}$ values. But another constraint may limit the value to $a=5$, potentially requiring a very large number of attempts to assign a random number to that variable before a valid value is found. To remedy this issue, systems commonly try to solve for the constraints before generating the random number in order to avoid generating random numbers failing to meet the constraints. But, as the interaction between constraints increases, it may become increasingly difficult to identify constraints on a given random variable, a problem which may lead to time wasted generating random values that do not meet the constraints, and thus longer execution times. A computer-based tool obtains the designs and analyzes the design description to find the set of constraints and identify the multiplication constraint. The computer-based tool then performs factorization to solve for the multiplication constraint and determine a set of potential valid factoring values for the random variables used in the multiplication constraint. The design problem is then solved by the computer based tool using the factoring values. A computer-implemented method for verification analysis is disclosed comprising obtaining a design description including a set of constraints wherein the set of constraints includes a multiplication constraint; analyzing the set of constraints to identify the multiplication constraint; performing factorization of a number to produce factoring values that solve the multiplication constraint; and solving a design problem within the design description based on the factoring values.

The set of constraints may include a second multiplication constraint that includes one or more common variables with the multiplication constraint, the method further comprising performing factorization for the second multiplication constraint. The method may further comprise determining a greatest common divisor (GCD) for the multiplication constraint and the second multiplication constraint; and performing factorization of the GCD to produce factoring values for the one or more common variables. The factorization may be performed on an overflow representation of the number. The overflow representation may have a precision larger than a largest precision of variables of the multiplication constraint. A low order set of bits of the overflow representation may equal the number and at least one bit of a high order set of bits of the overflow representation may not equal to zero. At least one of the factoring values may be larger than the number. The method may further comprise looping through the factoring values until one or more values are determined which satisfy other constraints. The method may further comprise using the factoring values within a constraint solver. The factoring values may yield prime factors for the multiplication constraint. The multiplication constraint may encapsulate a portion of an environment surrounding a design-under-test. The method may further comprise verifying a design based on the design description using the factoring values. The method may further comprise randomly selecting from the factoring values to solve a design problem within the design description. The method may further comprise selecting a subset of the factoring values based on other constraints within the set of constraints. The multiplication constraint may use an integer value. The multiplication constraint may use an integer variable. The method may further comprise using the factoring values in a second design problem. The solving may combine a word-level branch-and-bound search with the factoring values and wherein a uniform distribution of solutions is generated by randomizing variable selection. The method may further comprise storing the factoring values in a data structure to augment the design description. The factoring values may be used in place of random stimulus. The method may further comprise using the factoring values within a branch-and-bound solution effort. The method may further comprise using ATPG when the solving does not yield a valid solution based on the factoring values. The set of constraints may include soft constraints. The design problem may be for a semiconductor chip. The design problem may be represented as a random process. The method may further comprise caching a solution based on the factoring values.

In embodiments, a computer-implemented method for semiconductor analysis may comprise: obtaining a design description for a semiconductor chip where the design description includes a multiplication constraint; identifying the multiplication constraint; factoring the multiplication constraint to produce factoring values; and solving a design problem for the semiconductor chip using the factoring values. In some embodiments, a computer system for verification analysis may comprise: a memory which stores instructions; one or more processors coupled to the memory wherein the one or more processors are configured to: obtain a design description including set of constraints wherein the set of constraints includes a multiplication constraint; analyze the set of constraints to identify the multiplication constraint; perform factorization to produce factoring values that solve the multiplication constraint; and solve a design problem within the design description based on the factoring values. In embodiments, a computer program product embodied in a non-transitory computer readable medium for verification analysis may comprise: code for obtaining a design description including set of constraints wherein the set of constraints includes a multiplication constraint; code for analyzing the set of constraints to identify the multiplication constraint; code for performing factorization to produce factoring values that solve the multiplication constraint; and code for solving a design problem within the design description based on the factoring values.

Various features, aspects, and advantages of various embodiments will become more apparent from the following further description.

BRIEF DESCRIPTION OF THE DRAWINGS

The following detailed description of certain embodiments may be understood by reference to the following figures wherein:

FIG. 3 is an example program showing multiplication constraint.

FIG. 4 is an example of factorization solving.

DETAILED DESCRIPTION

Figure 1:
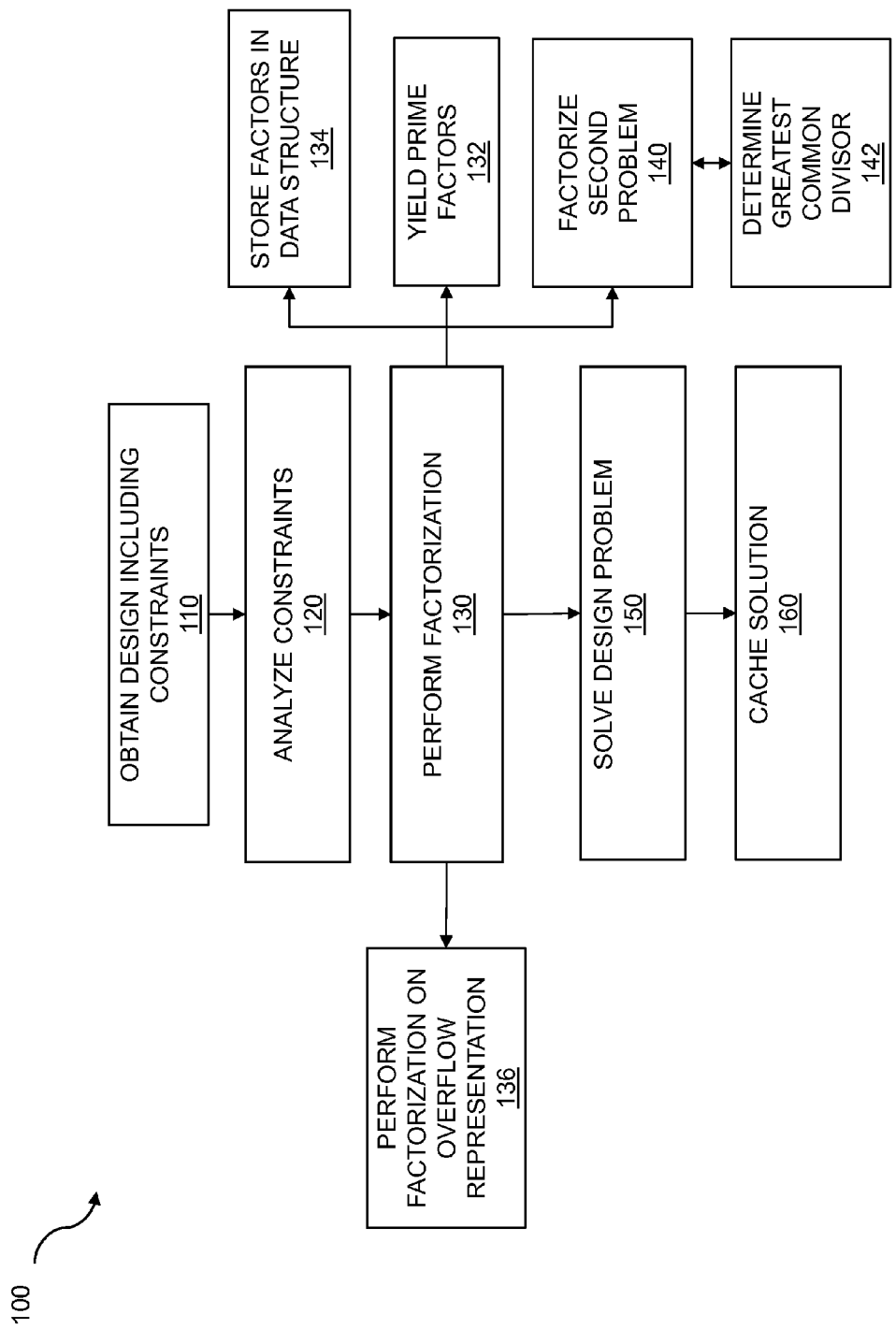
FIG. 1 is a flow diagram for solving multiplication constraints by factorization.

Solving for constraints of a design problem involves determining a set of potentially valid values for a random variable within the design problem. Some designs may include a multiplication constraint, where a product of two or more random variables may be constrained to be equal to a constant, or another random variable having a known value at the time of the solving. If the random variables are integers or fixed-point representations of a number which can be mapped to an integer representation, the multiplication constraint limits the potentially valid values of the random variables to a small number of options which are integer factors of the product. All numbers factor to factors of "1" and the number, these two factors representing the only two factors of a prime number. But even non-prime numbers include a relatively small number of valid factors. For example, the number 20 is factored as 2×2×5; thus 1, 2, 4, 5, 10, and 20 represent the possible factors of 20.

The traditional approach of assigning a random number to the random variables used as multipliers, which may refer to either the multiplier or multiplicand as used herein, and then checking against the constraint is very inefficient because only a small number of integers (6 in the previously given example of factoring the number 20) are valid assignments for either variable out of the $2^n$ possible integers where "n" is the precision of the variable. But factoring the multiplication constraint allows a solution to be randomly chosen only from the valid choices, greatly increasing efficiency. So if the constraint x×y=20 is included in the design problem, the valid choices for (x, y) may be limited to (1, 20), (2, 10), (4, 5), (5, 4), (10, 2), and (20, 1). In some cases, additional constraints may be included in the design which may allow further limiting of the choices. So for example if the additional constraints x>1 and x<y are included, then the valid choices can be further limited to (2, 10), and (4, 5). Some embodiments may assign a random factor for a variable of the multiplication constraint and then attempt to solve for other constraints. If other constraints are incompatible with the assignment, another valid factor may be assigned to the variable and then another attempt may be made to satisfy the other constraints. If none of the factors leads to a valid solution, embodiments may backtrack and change variable assignments that were made earlier and then factor the problem again to try for a valid solution to the design problem. Depending on the embodiment, the multipliers of a multiplication constraint may be assigned as a group, or one multiplier may be assigned to a random factor and treated as a constant, and then the other multipliers assigned later.

If two multiplication constraints share a common variable, a set of common factors may be created for the common variable. In one embodiment, the multipliers of the two multiplication constraints are all assigned as a set, but in other embodiments, the common variable may be assigned first based on the common factors, and then the other variables assigned later treating the common variable as a constant. As an example, imagine that a design problem includes the constraints x×y=20 and y×z=28. Common factors of the two multiplication constraints are 1, 2, and 4; this allows "y" to be assigned one of those factoring values, and then "x" and "z" to be assigned according to the assignment of "y".

Additional enhancements to this approach may use an overflow representation of the constant for the factoring. In some embodiments, the overload representation may be an optional feature of the tool, and may be enabled or disabled by a user. The overload representation may be used if the factorization of the constant alone does not yield a valid solution when other constraints of the design problem are included. So if the constraints x×y=20, x>1, and y>10 are included in the design problem, the factors of 20 do not allow for a valid solution for "x" and "y." In this example, assume that "x" is a 2-bit integer and "y" is a 5-bit integer, so the product of those two is a 7-bit integer. Instead of factoring the number 20, a number may be created for factoring where the lower five bits, or the same number of bits as the highest precision multiplier, are equal to 20, and the upper two bits are set to the random number R other than 0. If this is done, the number to be factored becomes $20+2^5 \times R$, the overload representation of the original number. Factoring this overload representation can provide an alternative set of valid factors for the variables "x" and "y". Going back to the example, if the random number R is equal to 1, and an overload representation of 20 is 42, factoring 42 provides possible factors of 1, 2, 3, 6, 7, 14, 21, and 42. But since the variables are limited in their precision—x<4 and y<32—possible valid factors for (x, y) are (2, 21) and (3, 14).

Various embodiments may incorporate factoring of multiplication constants into a branch and bound solver, some other type of constraint solver, or as a stand-alone application. Various design languages may be used to describe the multiplication constraint, either as a part of the existing syntax of the language or as an extension to the language. The high-level design information for a design problem may be expressed in a design language such as Verilog™, VHDL™, SystemVerilog™, SystemC™, Vera™, e™, or another design language. Constrained random variables may be useful for verification of electronic systems, including integrated circuits, although other types of design problems may also include multiplication constraints that may be handled using the techniques described herein.

FIG. 1 is a flow diagram for solving multiplication constrains by factorization. The flow 100 describes a computer-implemented method for verification analysis and comprises obtaining a design description including a set of constraints 110 wherein the set of constraints includes a multiplication constraint. The design problem may be for a semiconductor chip, or any other type of electronic system. The set of constraints may include soft constraints and/or hard constraints. A hard constraint is a constraint that must always be met, while a soft constraint is a constraint that should be met if possible, but may be ignored if necessary. Constraints may be applied to a random variable, which is a variable that will be assigned a random value. The constraint limits the random value assigned to the random variable to values which meet the constraint.

The flow 100 includes analyzing the set of constraints 120 to identify the multiplication constraint. A multiplication constraint is a constraint that includes at least two random variables multiplied together. In some cases, the multiplication constraint may include more than two random variables multiplied together. The product of the variables may be set to a constant, or to a variable whose value is known and can be treated as a constant at the time the constraint is evaluated. In some embodiments, the multiplication constraint uses an integer value for the constant, while other embodiments may use a fixed-point value. If a fixed-point value is used for the variables, the factoring may treat the fixed-point numbers as integers by scaling the problem, performing integer factoring, and scaling back the factors.

The flow 100 includes performing factorization 130 of a number to produce factoring values which solve the multiplication constraint. The factorization calculates factoring values which are factors of the constant of the multiplication constraint and are, therefore, potentially valid values for the random variables used as the multipliers in the multiplication constraint. In some embodiments, the factoring values yield prime factors 132 for the multiplication constraint. Other embodiments may generate a list of all possible factors of the constant, or a subset of all possible factors. In some embodiments, the flow 100 may include storing the factoring values in a data structure 134 to augment the design description. In some embodiments, the factorization may be performed on an overflow representation of the number 136.

In some cases, the set of constraints may include a second multiplication constraint containing one or more common variables shared with the multiplication constraint. In such cases, the flow 100 may also include performing factorization for the second multiplication constraint 140. The factoring values of the design problem may then be checked against the second multiplication constraint to see which factoring values may be valid for a common variable, thus the factoring values may be used in a second design problem. In some embodiments, the flow 100 may include determining a greatest common divisor (GCD) 142 for the multiplication constraint and the second multiplication constraint, and performing factorization of the GCD to produce factoring values for the one or more common variables.

The flow 100 continues with solving a design problem 150 within the design description based on the factoring values. The solving may include validating the factoring values against other constraints in the design problem. The solving may also include assigning random values to other random variables within the design problem. The solving may be an incremental solving with only a portion of the constraints of the design problem obtained being solved. The flow 100 may also include caching a solution 160 based on the factoring values. Caching the solution may reduce execution time by allowing re-use of a solution instead of requiring a recalculation of the solution. An instance when this re-use proves useful is in the case of an incremental solution which does not include all the constraints of a design problem, and may be revisited in the process of adding new constraints and/or backtracking if another constraint evaluated later cannot be honored. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
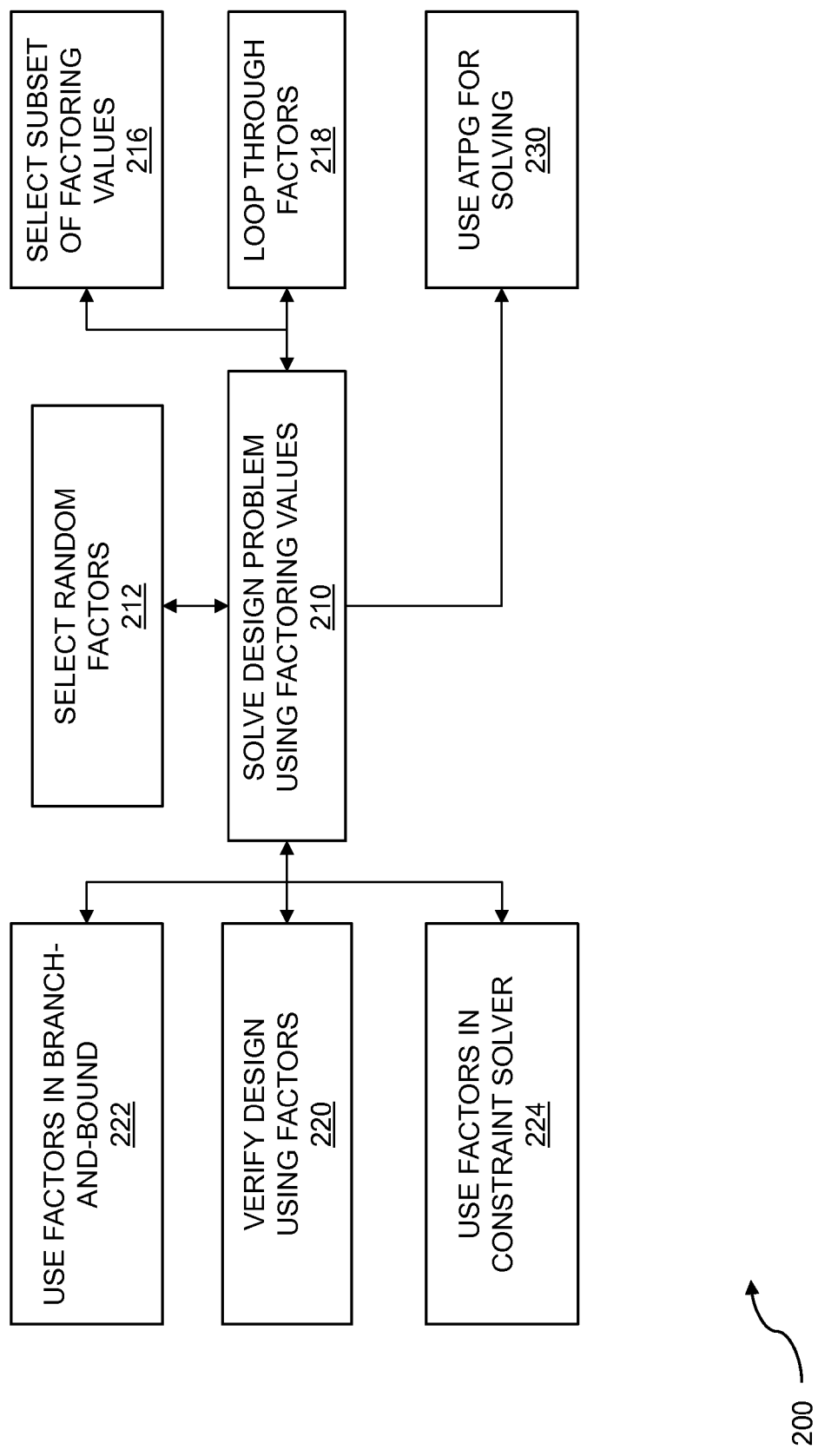
FIG. 2 is a flow diagram showing solving with factorization.

FIG. 2 is a flow diagram showing solving with factorization. The flow 200 shows solving a design problem using factoring values 210. The flow 200 includes randomly selecting from the factoring values 212 to solve a design problem within the design description. The solving may randomly select from factoring values for a random variable used in a multiplication constraint of a design problem. Some embodiments may select a subset of the factoring values 216 based on other constraints within the set of constraints. In some cases, other constraints may directly eliminate some of the factoring values as valid assignments to the random variable. In some cases, other constraints conflict with some of the factoring values. In such cases, the flow 200 may include looping through the factoring values 218 until one or more values which satisfy the other constrains are determined.

Some embodiments may verify a design 220 based on the design description using the factoring values. The random variables limited by the multiplication constraints may represent test vectors, so that the factoring values which are assigned to those random variables may be used as test vectors to verify the design. Many traditional verification tools use a random stimulus to verify a design, so if the factoring values are used for the random variables, the factoring values may be used in place of the random stimulus. In some embodiments, the solving combines a word-level branch-and-bound search with the factoring values. In such an embodiment, a uniform distribution of solutions is generated by randomizing variable selection from within the factoring values. The randomly selected factoring values are provided to the branch-and-bound search so that the branch-and-bound search can use them to solve for other constraints. Thus, the flow 200 may use the factoring values within a branch-and-bound 222 solution effort; additionally, the factoring values may be used within a constraint solver 224. In some embodiments, the flow 200 continues by using an automatic test pattern generator (ATPG) 230 when the solving does not yield a valid solution based on the factoring values. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

FIG. 3 is an example program 300 showing a multiplication constraint. The program defines four random 32-bit variables 310—a, b, c, d—for an object of class "cls" which may be used as verification vectors to validate a design under test. The program 300 includes three constraints, a multiplication constraint 320, a bit-field constraint 322 and an addition constraint 324. The multiplication constraint may use an integer value and/or an integer variable, as shown. The program 300 continues by creating an object of class "cls" and then assigns random variables to the object five times 330, so the design problem may be represented as a random process. Because the variables may be used as verification vectors, the multiplication constraint may encapsulate a portion of an environment surrounding a design under test.

The multiplication constraint uses a constant as the product result which can be factored to prime factors of $2^3$, and 5, with the set of integer factoring values being 1, 2, 4, 5, 8, 10, 20, and 40. One assignment of the three multipliers (a, b, c) could be the values 1, 2, and 20. But if the addition constraint 324 is not consistent with that assignment, another assignment may be made, such as the variables 4, 5, and 2. Because the variable "d" is not used in the other constraints, it can be met as long as c[6:2] is not equal to 11111b, and that value cannot create a valid factor of 40 for the variable "c." In at least one embodiment, the addition constraint may be evaluated in light of the factorization of the multiplication constant. Additionally, the variable "c" may be implicated such that "c" cannot be 10, 20 or 40, limiting valid values for "c" to 1, 2, 4, and 5. In some embodiments "c" may be assigned first and then "a" and "b" assigned in incremental passes of the solver which may then factor a×b=40/c where "c" is known. Each time that the random assignment 330 is performed, a random selection of valid factors for at least one of the variables may be made. Random, as the word is used herein and in the claims, may refer to either a true random number or a pseudo-random number. The pseudo-random number may have the same statistical characteristics as a true random number, although some embodiments may use a pseudo-random number generator that varies from the statistical characteristics of a random number without departing from the scope of the meaning of "random" as used herein.

In some embodiments, the factorization may be performed on an overflow representation of the number. If another constraint c>5 were added to the program 300, the factoring of the number 40, as shown in the previous paragraph, would not be able to satisfy all the constraints. Because "a," "b," and "c" are 32-bit numbers, the product of the three is actually a 96-bit number under the rules of multiplication. An overflow representation may be created where the bottom 32 bits of the overflow representation are set to 40 and at least one of the upper 64 bits is set to a non-zero value. To generalize, the precision of the product is equal to the sum of the precision of the multipliers, thus the overflow representation has a precision larger than the largest precision of the variables in the multiplication constraint. The overflow representation of a number may be created so that a low-order set of bits of the overflow representation equals the number, and at least one bit of a high-order set of bits of the overflow representation is not equal to zero. The number of bits for the low-order set of bits may be at least as large as the largest number of bits of a multiplier. For example, the overflow representation may be equal to $R \times 2^n + N$, where "n" represents the largest number of bits of a multiplier variable, N is the constant being factored, and R is a non-zero random number.

Returning to the example, an overflow representation for 40 may be created where R=10 and n=32, so that the overflow representation 42949673000 (or 0 . . . 0A00000028 in hex), has prime factors of $2^3$, $5^3$, 13, 41, 61, and 1321. One assignment of factoring values of the overflow representation for (a, b, c) is ($2^3 \times 5^3 \times 13$, 41×61, 1321), or (13000, 2501, 1321), which honors the other constraints, including the added constraint of c>5. So if an overflow representation is used, at least one of the factoring values may be larger than the original number being factored.

FIG. 4 is an example of factorization solving. The pseudo code 400 describes a process of solving a design problem involving multiplication constraints. The code 410 includes looping through the factoring values until one or more values are determined which satisfy other constraints. The looping continues until all the variables have been assigned a value. The code 420 checks to see if the current variable being assigned is a part of a multiplication constraint, allowing factorization to be performed. Examples of a multiplication constraint which cannot be factored include a multiplication constraint where the product is not a constant or includes a variable which has not yet been assigned. If the variable is a part of a multiplication constraint which can be factored, the variable may be assigned by factoring using the code 430. The code may then check to see if the variable was successfully assigned by the factoring; if it was not successfully assigned, a branch-and-bound solver may be used to assign a value to the variable using the code 440. If either the factorization code 430 or the branch-and-bound solver code 440 determines that the current state of the problem makes it impossible to honor all the constraints, the code 450 may backtrack, undoing the previous variable assignment to make a new random assignment and try again. The looping continues until all the variables have been assigned.

Figure 5:
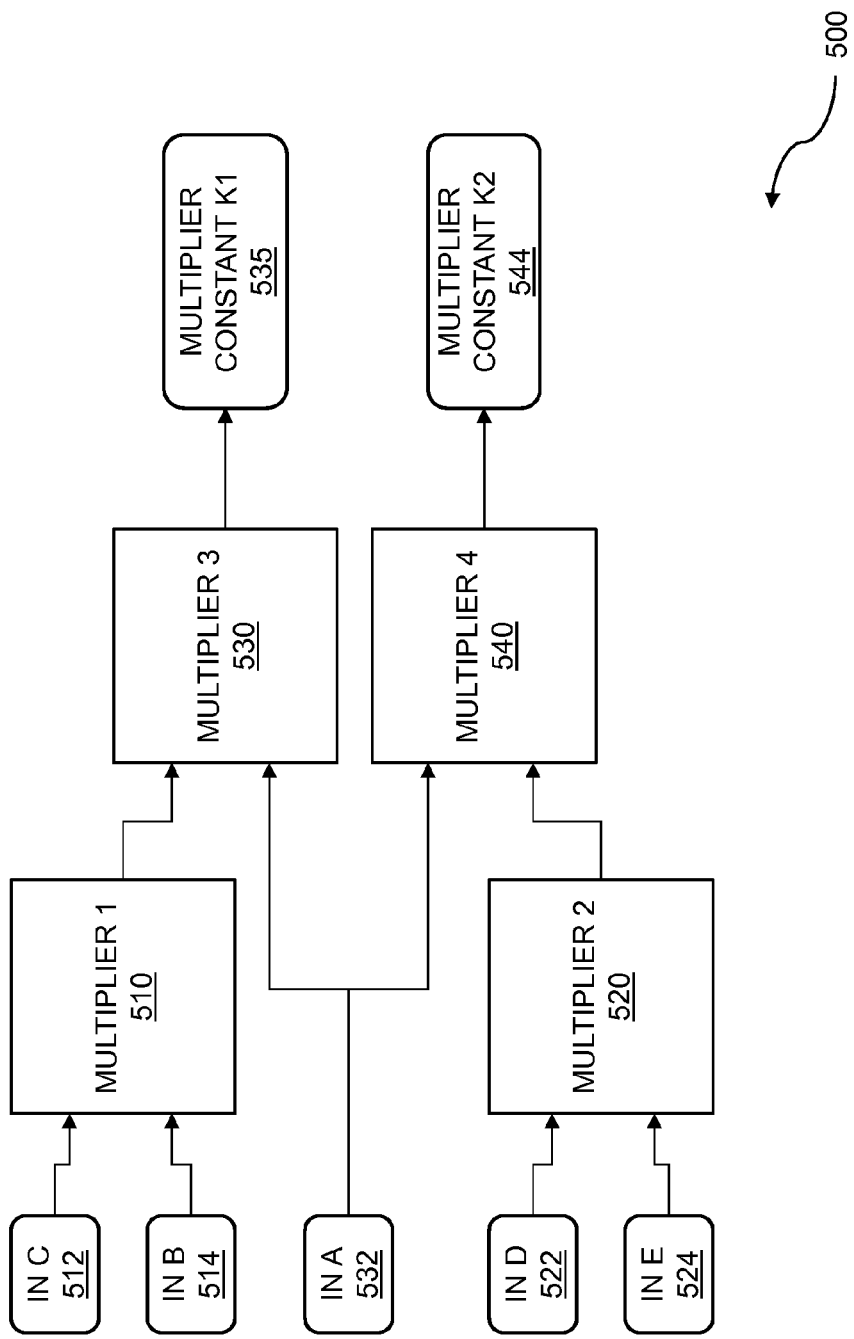
FIG. 5 is an example logic circuit with multiplier constraints.

FIG. 5 is an example logic circuit 500 with multiplier constraints. A first multiplier 510 has inputs C 512 and B 514. A second multiplier 520 has inputs D 522 and E 524. A third multiplier 530 has one input coupled to the first multiplier 510, a second input of A 532. The output of the third multiplier is set to a constant K1 535. A fourth multiplier 540 has one input coupled to the second multiplier 520, and a second input of A 532. The output of the fourth multiplier is set to a constant K2 544. The logic circuit 500 represents the equations A×B×C=K1 comprising a multiplication constraint, with A×D×E=K2 representing a second multiplication constraint. Thus, for a design including the logic circuit 500, the set of constraints may include a second multiplication constraint which includes one or more common variables with the multiplication constraint.

To solve for the variables, both the multiplication constraint and the second multiplication constraint may be factored; the method may include performing factorization for the second multiplication constraint. The solving may include determining a greatest common divisor (GCD) for the multiplication constraint and the second multiplication constraint. Once the GCD has been determined, the solving may perform factorization of the GCD to produce factoring values for the one or more common variables. So if K1=60 and K2=72, the GCD is 6 and has valid factoring values of 1, 2, 3, and 6, with one of the valid factoring values of 6 potentially assigned to the common variable A. So if 3 is assigned to A, the two multiplication constraints may be reduced to B×C=20 and D×E=24, both of which may be individually factored to assign the variables B, C, D, and E.

Figure 6:
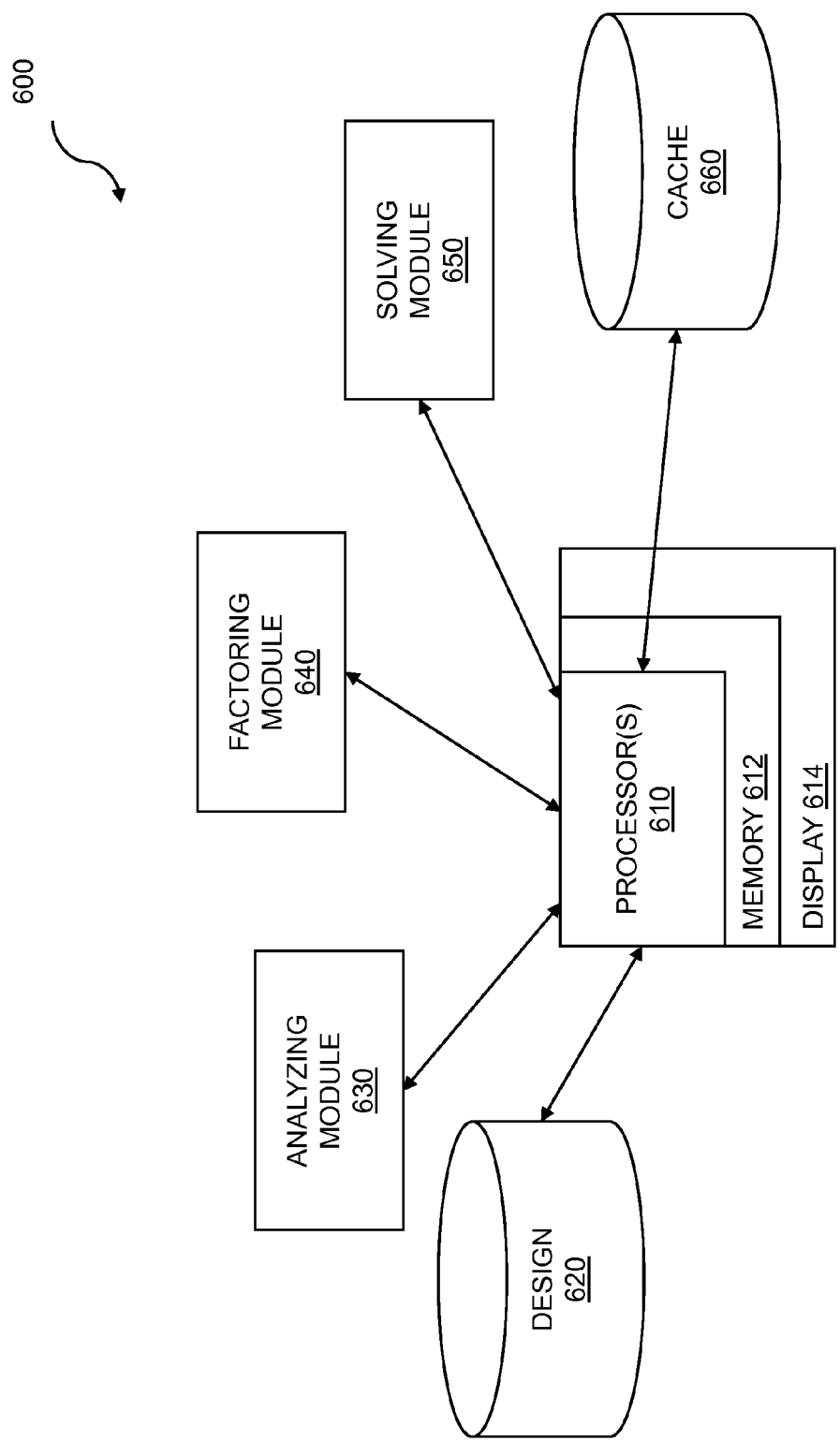
FIG. 6 is a system diagram for solving multiplication constraints by factorization.

FIG. 6 is a system diagram for solving multiplication constraints by factorization. The system 600 may be used in a computer-implemented method for semiconductor analysis. The computer system 600 for verification analysis includes one or more processors 610 coupled to a memory 612 which stores instructions. Some embodiments may include a display 614. The display may be any electronic display, including but not limited to, a computer display, a laptop screen, a net-book screen, a tablet computer screen, a cell phone display, a mobile device display, a remote with a display, a television, a projector, or the like. In the system 600, the one or more processors 610 may be configured to obtain a design description 620 including set of constraints wherein the set of constraints includes a multiplication constraint, analyze the set of constraints to identify the multiplication constraint, perform factorization to produce factoring values that solve the multiplication constraint, and solve a design problem within the design description based on the factoring values. In some embodiments, various parts of the solution may be stored in a cache 660, which may be a hard drive or other computer storage medium. Thus a computer-implemented method for semiconductor analysis comprises obtaining a design description for a semiconductor chip where the design description includes a multiplication constraint, identifying the multiplication constraint, factoring the multiplication constraint to produce factoring values, and solving a design problem for the semiconductor chip using the factoring values.

The system 600 may include a computer program product embodied in a non-transitory computer readable medium for verification analysis. The computer program product embodied in a non-transitory computer readable medium for verification analysis includes code for obtaining a design description containing a set of constraints wherein the set of constraints includes a multiplication constraint, code for analyzing the set of constraints to identify the multiplication constraint, code for performing factorization to produce factoring values that solve the multiplication constraint, and code for solving a design problem within the design description based on the factoring values.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or 'system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for verification analysis comprising:
    obtaining a design description including a set of constraints wherein the set of constraints includes a multiplication constraint;
    analyzing the set of constraints to identify the multiplication constraint;
    performing, one or more processors, factorization of a number to produce factoring values that solve the multiplication constraint, wherein the factorization is performed on an overflow representation of the number; and
    solving a design problem within the design description based on the factoring values.

2. The method of claim 1 wherein the set of constraints includes a second multiplication constraint that includes one or more common variables with the multiplication constraint, the method further comprising performing factorization for the second multiplication constraint.

3. The method of claim 2 further comprising determining a greatest common divisor (GCD) for the multiplication constraint and the second multiplication constraint; and performing factorization of the GCD to produce factoring values for the one or more common variables.

4. The method of claim 1 wherein the overflow representation has a precision larger than a largest precision of variables of the multiplication constraint.

5. The method of claim 1 wherein a low order set of bits of the overflow representation equals the number; and at least one bit of a high order set of bits of the overflow representation is not equal to zero.

6. The method of claim 1 wherein at least one of the factoring values is larger than the number.

7. The method of claim 1 further comprising looping through the factoring values until one or more values are determined which satisfy other constraints.

8. The method of claim 1 further comprising using the factoring values within a constraint solver.

9. The method of claim 1 wherein the factoring values yield prime factors for the multiplication constraint.

10. The method of claim 1 wherein the multiplication constraint encapsulates a portion of an environment surrounding a design-under-test.

11. The method of claim 1 further comprising verifying a design based on the design description using the factoring values.

12. The method of claim 1 further comprising randomly selecting from the factoring values to solve a design problem within the design description.

13. The method of claim 1 further comprising selecting a subset of the factoring values based on other constraints within the set of constraints.

14. The method of claim 1 wherein the multiplication constraint uses an integer value.

15. The method of claim 1 wherein the multiplication constraint uses an integer variable.

16. The method of claim 1 further comprising using the factoring values in a second design problem.

17. The method of claim 16 wherein the solving combines a word-level branch-and-bound search with the factoring values and wherein a uniform distribution of solutions is generated by randomizing variable selection.

18. The method of claim 1 further comprising storing the factoring values in a data structure to augment the design description.

19. The method of claim 1 wherein the factoring values are used in place of random stimulus.

20. The method of claim 1 further comprising using the factoring values within a branch-and-bound solution effort.

21. The method of claim 1 further comprising using ATPG when the solving does not yield a valid solution based on the factoring values.

22. The method of claim 1 wherein the set of constraints includes soft constraints.

23. The method of claim 1 wherein the design problem is for a semiconductor chip.

24. The method of claim 1 wherein the design problem is represented as a random process.

25. The method of claim 1 further comprising caching a solution based on the factoring values.

26. A computer-implemented method for semiconductor analysis comprising:
    obtaining a design description for a semiconductor chip where the design description includes a multiplication constraint;
    identifying the multiplication constraint;
    factoring, one or more processors, the multiplication constraint to produce factoring values, wherein the factoring is performed on an overflow representation of the number; and
    solving a design problem for the semiconductor chip using the factoring values.

27. A computer system for verification analysis comprising:
    a memory which stores instructions;
    one or more processors coupled to the memory wherein the one or more processors are configured to:
        obtain a design description including set of constraints wherein the set of constraints includes a multiplication constraint;
        analyze the set of constraints to identify the multiplication constraint;

perform factorization to produce factoring values that solve the multiplication constraint, wherein the factorization is performed on an overflow representation of the number; and solve a design problem within the design description based on the factoring values.

28. The system of claim 27 wherein the set of constraints includes a second multiplication constraint that includes one or more common variables with the multiplication constraint, wherein the one or more processors are further configured to perform factorization for the second multiplication constraint and to determine a greatest common divisor (GCD) for the multiplication constraint and the second multiplication constraint, and to perform factorization of the GCD to produce factoring values for the one or more common variables.

29. The system of claim 27 wherein the one or more processors are further configured to loop through the factoring values until one or more values are determined which satisfy other constraints.

30. The system of claim 27 wherein the one or more processors are further configured to randomly select from the factoring values to solve a design problem within the design description.

31. The system of claim 27 wherein the one or more processors are further configured to select a subset of the factoring values based on other constraints within the set of constraints.

32. A computer program product embodied in a non-transitory computer readable medium for verification analysis comprising:

code for obtaining a design description including set of constraints wherein the set of constraints includes a multiplication constraint;

code for analyzing the set of constraints to identify the multiplication constraint;

code for performing factorization to produce factoring values that solve the multiplication constraint, wherein the factorization is performed on an overflow representation of the number; and code for solving a design problem within the design description based on the factoring values.

33. The computer program product of claim 32 wherein the set of constraints includes a second multiplication constraint that includes one or more common variables with the multiplication constraint, the computer program product further comprising code for performing factorization for the second multiplication constraint and code for determining a greatest common divisor (GCD) for the multiplication constraint and the second multiplication constraint, and code for performing factorization of the GCD to produce factoring values for the one or more common variables.

34. The computer program product of claim 32 further comprising code for looping through the factoring values until one or more values are determined which satisfy other constraints.

35. The computer program product of claim 32 further comprising code for randomly selecting from the factoring values to solve a design problem within the design description.

36. The computer program product of claim 32 further comprising code for selecting a subset of the factoring values based on other constraints within the set of constraints.

* * * * *